United States Patent
Jha et al.

(10) Patent No.: US 9,601,406 B2
(45) Date of Patent: Mar. 21, 2017

(54) COPPER NANOROD-BASED THERMAL INTERFACE MATERIAL (TIM)

(71) Applicants: Chandra M. Jha, Chandler, AZ (US); Feras Eid, Chandler, AZ (US); Johanna M. Swan, Scottsdale, AZ (US); Ashish Gupta, Chandler, AZ (US)

(72) Inventors: Chandra M. Jha, Chandler, AZ (US); Feras Eid, Chandler, AZ (US); Johanna M. Swan, Scottsdale, AZ (US); Ashish Gupta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 648 days.

(21) Appl. No.: 13/782,893

(22) Filed: Mar. 1, 2013

(65) Prior Publication Data
US 2014/0246770 A1    Sep. 4, 2014

(51) Int. Cl.
*H01L 23/34* (2006.01)
*H01L 21/8238* (2006.01)
(Continued)

(52) U.S. Cl.
CPC .......... *H01L 23/3736* (2013.01); *H01L 24/11* (2013.01); *H01L 24/13* (2013.01); *H01L 24/27* (2013.01); *H01L 24/29* (2013.01); *H01L 23/3737* (2013.01); *H01L 23/433* (2013.01); *H01L 24/16* (2013.01); *H01L 24/32* (2013.01); *H01L 24/73* (2013.01); *H01L 24/83* (2013.01); *H01L 24/92* (2013.01);
(Continued)

(58) Field of Classification Search
USPC .......................................... 257/712; 438/122
See application file for complete search history.

(56) References Cited

U.S. PATENT DOCUMENTS

| | | | |
|---|---|---|---|
| 2005/0257821 A1* | 11/2005 | Ramanathan | ........... H01L 23/38 136/203 |
| 2006/0251897 A1* | 11/2006 | Pan | ........ H01L 23/373 428/408 |

(Continued)

OTHER PUBLICATIONS

Karabacak, Tansel, et al., "Low Temperature Melting of Copper Nanorod Arrays", American Institute of Physics, Journal of Applied Physics 99, 064304 (2006), 6 pages.

(Continued)

*Primary Examiner* — Dale E Page
*Assistant Examiner* — Wilner Jean Baptiste
(74) *Attorney, Agent, or Firm* — Blakely, Sokoloff, Taylor & Zafman LLP

(57) ABSTRACT

A copper nanorod thermal interface material (TIM) is described. The copper nanorod TIM includes a plurality of copper nanorods having a first end thermally coupled with a first surface, and a second end extending toward a second surface. A plurality of copper nanorod branches are formed on the second end. The copper nanorod branches are metallurgically bonded to a second surface. The first surface may be the back side of a die. The second surface may be a heat spread or a second die. The TIM may include a matrix material surrounding the copper nanorods. In an embodiment, the copper nanorods are formed in clusters.

21 Claims, 9 Drawing Sheets

(51) Int. Cl.
*H01L 23/373* (2006.01)
*H01L 23/00* (2006.01)
*H01L 23/433* (2006.01)

(52) U.S. Cl.
CPC ............. *H01L 2224/0401* (2013.01); *H01L 2224/04026* (2013.01); *H01L 2224/05568* (2013.01); *H01L 2224/05647* (2013.01); *H01L 2224/1133* (2013.01); *H01L 2224/1147* (2013.01); *H01L 2224/11826* (2013.01); *H01L 2224/13017* (2013.01); *H01L 2224/13019* (2013.01); *H01L 2224/13078* (2013.01); *H01L 2224/16225* (2013.01); *H01L 2224/16227* (2013.01); *H01L 2224/271* (2013.01); *H01L 2224/2745* (2013.01); *H01L 2224/27436* (2013.01); *H01L 2224/2929* (2013.01); *H01L 2224/29193* (2013.01); *H01L 2224/29393* (2013.01); *H01L 2224/29499* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/81011* (2013.01); *H01L 2224/81191* (2013.01); *H01L 2224/83104* (2013.01); *H01L 2224/83191* (2013.01); *H01L 2224/92125* (2013.01); *H01L 2224/94* (2013.01); *H01L 2225/06524* (2013.01); *H01L 2225/06589* (2013.01); *H01L 2924/15311* (2013.01); *H01L 2924/16251* (2013.01); *H01L 2924/16724* (2013.01); *H01L 2924/16747* (2013.01); *H01L 2924/3511* (2013.01); *Y10T 428/249921* (2015.04); *Y10T 428/26* (2015.01)

(56) References Cited

U.S. PATENT DOCUMENTS

| | | | | |
|---|---|---|---|---|
| 2008/0224357 | A1* | 9/2008 | Allmendinger | B29C 44/3461 264/402 |
| 2008/0316711 | A1* | 12/2008 | Dimitrakopoulos | F28F 21/02 361/718 |
| 2009/0232991 | A1* | 9/2009 | Wang | H01L 23/373 427/294 |
| 2010/0310941 | A1* | 12/2010 | Kumta | H01B 1/04 429/231.95 |
| 2011/0034339 | A1* | 2/2011 | Goyal | 505/237 |
| 2013/0119527 | A1* | 5/2013 | Luo | H01L 23/36 257/690 |
| 2013/0256868 | A1* | 10/2013 | Aliyev | H01L 21/50 257/713 |
| 2014/0085829 | A1* | 3/2014 | Yamashita | H01L 23/49827 361/717 |

OTHER PUBLICATIONS

Karabacak, T., et al., "Physical self-assembly and the nucleation of three-dimensional nanostructures by oblique angle deposition", American Vacuum Society, J. Vac. Sci. Technol. A 22(4), Jul./ Aug. 2004, 7 pages.

Wang, Jian, et al., "Growth of Y-Shaped Nanorods Through Physical Vapor Deposition", Nano Letters, 2005, vol. 5, No. 12, American Chemical Society, Nov. 3, 2005, 4 pages.

Wang, Pei-I, et al., "Low Temperature Wafer Bonding by Copper Nanorod Array", Electrochemical and Solid-State Letters, The Electrochemical Society, Jan. 30, 2009, 4 pages.

Zhou, L.G., et al., "Characteristic Length Scale of Nanorod Diameter During Growth", The American Physical Society, PRL 101, 266102, Dec. 31, 2008, 4 pages.

\* cited by examiner

COPPER NANOROD-BASED THERMAL INTERFACE MATERIAL (TIM)

BACKGROUND

Conventional semiconductor package structures include a microprocessor, or die, mounted to a package substrate. Typically, an integral heat spreader (IHS) overlies the backside of the die. A thermal interface material (TIM) transfers heat generated by the die to the IHS, which then conducts the heat away from the die to additional heat removal elements, such as heat sinks. Die power consumption, die size, and heat density increases with each new generation of microprocessors, requiring higher performance heat removal solutions.

DETAILED DESCRIPTION

Figure 1A:
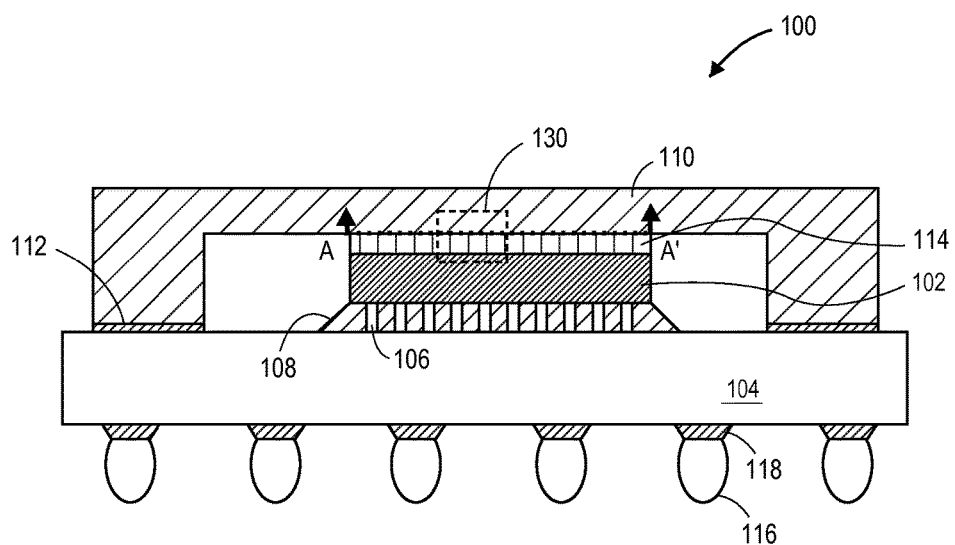
FIG. 1A illustrates a cross-sectional side view of a semiconductor package having a die thermally coupled with a heat spreader by a thermal interface material including copper nanorods, according to an embodiment of the invention.

A thermal interface material (TIM) having copper nanorods and a method of forming the TIM to thermally couple two surfaces are described. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Conventional thermal interface materials (TIMs) include solders, epoxy resins filled with metal or ceramic particles, thermal greases, and phase change materials. Such TIMs typically have a thermal resistance greater than 0.06 $C\text{-}cm^2/W$ and a bond line thickness greater than 20 µm for polymer TIM and greater than 200 um for solder TIM. High thermal stresses evolve at the thermal interface due to the different coefficients of thermal expansion (CTE) of the integral heat spreader (IHS) and the die. Solders and epoxy resins have a high modulus, in the GPa range, which can lead to delamination when stresses evolve at the TIM/IHS interface or the TIM/die interface. Delamination results in increased thermal resistance due to reduction of the thermal path. While thermal greases and phase change materials have a lower modulus, thermal greases may be pumped out of the thermal interface during thermal cycling and phase change materials have poor thermal conductivity.

In one aspect, embodiments of the invention describe a thermal interface material having ultra-low thermal resistance, thin form factor, lighter weight, and lower cost. Copper nanorods extend from the backside of the die to the IHS. The copper nanorods are metallurgically bonded to the IHS, providing low thermal resistance at the TIM/IHS interface. In addition, the copper nanorods may be metallurgically bonded to the backside of the die, providing a low contact resistance at the TIM/die interface. The copper nanorods have high bulk thermal conductivity, greater than 100 W/m/K. In addition, the copper nanorods have a length from 20 to 50 µm, enabling a bond line thickness (BLT) less than 50 µm. The combination of a low interfacial thermal resistance, high bulk thermal conductivity, and low BLT enables an ultra-low thermal resistance of less than 0.02 $C\text{-}cm^2/W$. The low BLT also enables a reduction in overall package z-height, for example, compared to packages in which solder TIM is used, which helps to achieve a lower form factor useful for mobile, tablet, and laptop applications. And further, the low BLT enables use of less material, resulting in a lighter overall package. Less material also contributes to a lower cost as compared to some conventional TIMs, such as solders.

In another aspect, the thermal interface material is able to accommodate CTE mismatch between the die and the IHS due to the high aspect ratio and corresponding flexibility of the copper nanorods. For example, the die and/or the IHS may warp due to thermal stresses, which may lead to differences in the BLT near edges of the die as compared to the BLT near the center of the die. These changes in BLT may place portions of the TIM under compressive or tensile stress. The copper nanorods may flex and/or deform to accommodate stresses without delaminating from the die or IHS.

In yet another aspect, the thermal interface material may be formed at low temperatures. For example, the copper nanorods and branches may be grown at room temperature. Then, the copper nanorod branches may be metallurgically bonded to the IHS at a temperature below 200° C. Low temperature processing reduces the risk for failure due to thermal stresses and also reduces the internal stress of the TIM.

In yet another aspect, the copper nanorod TIM may be formed at the individual device level, at the wafer level, or formed on a sacrificial surface and then applied to the thermal interface. For example, the copper nanorods may be grown over the back surface of an individual die or over the surface of an IHS. In another embodiment, the copper nanorod TIM may be formed over the surface of a wafer including multiple dies that have not yet been singulated. In yet another embodiment, the copper nanorod TIM may be formed on a sacrificial film or surface, and then transferred to a wafer or a die.

FIG. 1A illustrates a cross-sectional side view of a package 100 having a die 102 thermally coupled with an integral heat spreader (IHS) 110 by copper nanorod thermal interface material (TIM) 114, according to an embodiment of the invention. In an embodiment, die 102 is mounted to substrate 104 by bumps 106. The space between die 102 and substrate 104 may be underfilled with underfill material 108. Substrate 104 may have interconnects 116 formed on contact pads 118 on the surface opposite die 102. Interconnects 116 may be used, for example, to mount package 100 to a printed circuit board (not shown).

In an embodiment, IHS 110 overlies die 102. In an embodiment, IHS 110 dissipates heat generated by die 102 by conducting heat away from die 102 toward the periphery of the package 100. IHS 110 may also conduct heat away from die 102 to additional heat transfer components. In an embodiment, IHS 110 encloses die 102. In an embodiment, IHS 110 is coupled with substrate 104 by adhesive 112. IHS 110 may overlie or enclose additional dies and/or package components (not shown). IHS 110 is formed from a material that conducts heat, for example, a metal. In an embodiment, IHS 110 is copper. IHS 110 may also be, for example, aluminum.

Figure 1B:
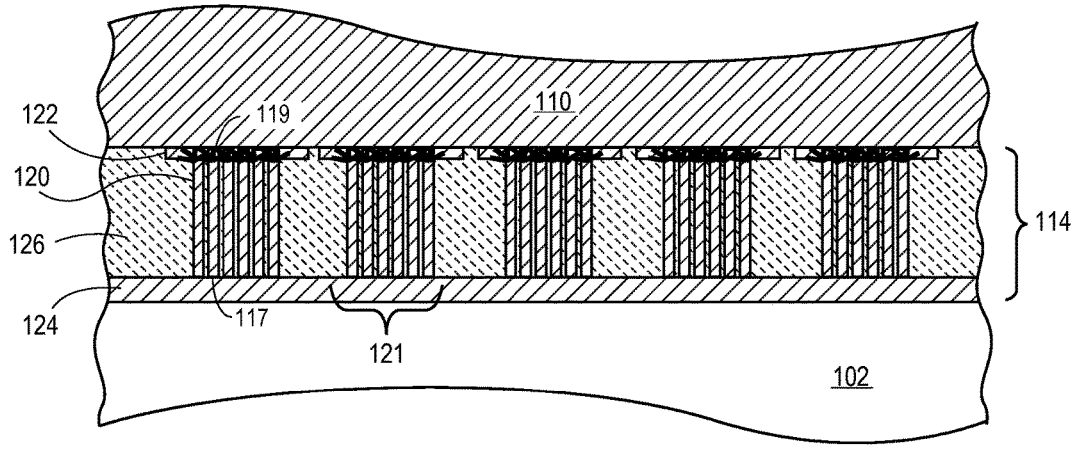
FIG. 1B illustrates a cross-sectional side view of a thermal interface material including clusters of copper nanorods thermally coupling the backside of a die to a heat spreader, according to an embodiment of the invention.

FIG. 1B is a close-up view of section 130 of FIG. 1A, showing copper nanorod TIM 114 thermally joining IHS 110 and the backside of die 102. In an embodiment, copper nanorod TIM 114 includes copper nanorods 120. In an embodiment, copper nanorod TIM 114 includes seed layer 124, formed over the backside surface of die 102. Copper nanorods 120 have a first end 117 thermally coupled with seed layer 124 and a second end 119 extending toward overlying IHS 110, according to an embodiment. In another embodiment, copper nanorods 120 are grown directly from the back surface of die 102. In an embodiment, one or more copper nanorods 120 are grouped in to clusters 121. In an embodiment, copper nanorods 120 have copper nanorod branches 122 extending from second end 119. In an embodiment, copper nanorod branches 122 are metallurgically bonded to IHS 110.

Copper nanorods 120 conduct heat between the backside surface of die 102 to IHS 110, according to an embodiment. In an embodiment, copper nanorods 120 are a single crystal of copper. In an embodiment, the high bulk thermal conductivity (~400 W/m/K) of copper enables effective thermal conduction by copper nanorods 120 through TIM 114. The length of copper nanorods 120 enables a low BLT, for example, less than 100 μm, according to an embodiment. In an embodiment, the BLT is less than 50 μm. In another embodiment, the BLT is from 20-30 μm. In an embodiment, copper nanorods 120 have a length from 20-50 μm. In an embodiment, copper nanorods have a length from 25-30 μm. In an embodiment, copper nanorods 120 have a diameter greater than 10 μm. In an embodiment, copper nanorods 120 have an aspect ratio from 1:2 to 1:10. In an embodiment, copper nanorods 120 have an average spacing greater than 10 μm. In another embodiment, copper nanorods 120 have an average spacing from 50 to 100 μm.

Copper nanorod TIM 114 includes copper nanorod branches 122 formed on each second end 119 of copper nanorods 120, according to an embodiment of the invention. In an embodiment, two copper nanorod branches are formed on each second end 119 of a copper nanorod 120. In an embodiment, copper nanorod branches 122 have a length less than 10 μm. In an embodiment, copper nanorod branches 122 have a length from 1 to 2 μm. In an embodiment, copper nanorod branches 122 have a diameter that is small enough to enable metallurgic bonding to a copper surface, such as that of IHS 110. In an embodiment, copper nanorod branches 122 have a diameter from 10-100 nm. The metallurgical bonding of copper nanorod branches 122 to IHS 110 enables a lower contact thermal resistance at the interface of TIM 114 with IHS 110, contributing to an overall lower thermal resistance for TIM 114.

In an embodiment, copper nanorod TIM 114 includes matrix material 126. Matrix material 126 may improve the overall conductivity of copper nanorod TIM 114 as compared to a copper nanorod TIM 114 without a matrix material. In another embodiment, matrix material 126 improves the mechanical rigidity of copper nanorod TIM 114, which in combination with the ductility of the copper nanorods enables the TIM 114 to function as a membrane, allowing for a low BLT. In an embodiment, matrix material 126 fills the spaces between IHS 110 and seed layer 124 that are not occupied by copper nanorods 120. In an embodiment, matrix material 126 fills the space between copper nanorod clusters 121. In an embodiment, matrix material 126 fills the space between copper nanorods 120 within a cluster 121. In another embodiment, matrix material 126 does not fill the space between copper nanorods 120 within a cluster 121. In an embodiment, the material composition of matrix material 126 is selected to enable filling of the space between die 102 and IHS 110 surrounding copper nanorods 120. Matrix material 126 may include conventional underfill materials, for example, but not limited to, epoxy. In an embodiment, matrix material 126 is filled with particles that improve the thermal conductivity of matrix material 126 and TIM 114, for example, but not limited to, metal or graphite fillers. In an embodiment, TIM 114 does not include a matrix material.

In an embodiment, the first ends 117 of copper nanorods 120 are thermally coupled to seed layer 124. In an embodiment, seed layer 124 is a material that facilitates the seeding and growth of copper nanorods 120. Seed layer 124 may be selected to enable growth of copper nanorods 120 having a desired crystallographic orientation. In an embodiment, seed layer 124 is formed over the entire backside surface of die 102. In an embodiment, one or more adhesion layers and/or diffusion barriers (not shown) are located between seed layer 124 and the surface of die 102. In an embodiment, seed layer 124 has been patterned to remove seed layer 124 from areas where copper nanowires 120 are not desired, such as in order to define clusters 121. In yet another embodiment, copper nanorods 120 are grown directly on the backside surface of die 102. In an embodiment, there is no seed layer 124. Seed layer 124 may be any material from which copper nanorods may be grown. In an embodiment, seed layer 124 is a material having a (110) crystallographic orientation. In an embodiment, seed layer 124 is copper. In another embodiment, seed layer 124 is silicon.

In an embodiment, copper nanorods 120 are grouped into clusters 121. Grouping copper nanorods 120 into clusters 121 may lower the modulus of copper nanorod TIM 114. In addition, grouping copper nanorods 120 into clusters 121 may facilitate the inclusion of a matrix material 126 by providing larger channels between clusters through which the matrix material may flow during application. In an embodiment, clusters 121 may include up to 25 copper nanorods 120. Within a cluster 121, copper nanorods 120 may have an average spacing greater than 10 µm. In an embodiment, the average spacing between copper nanorods 120 is from 10 to 100 µm.

Figure 1C:
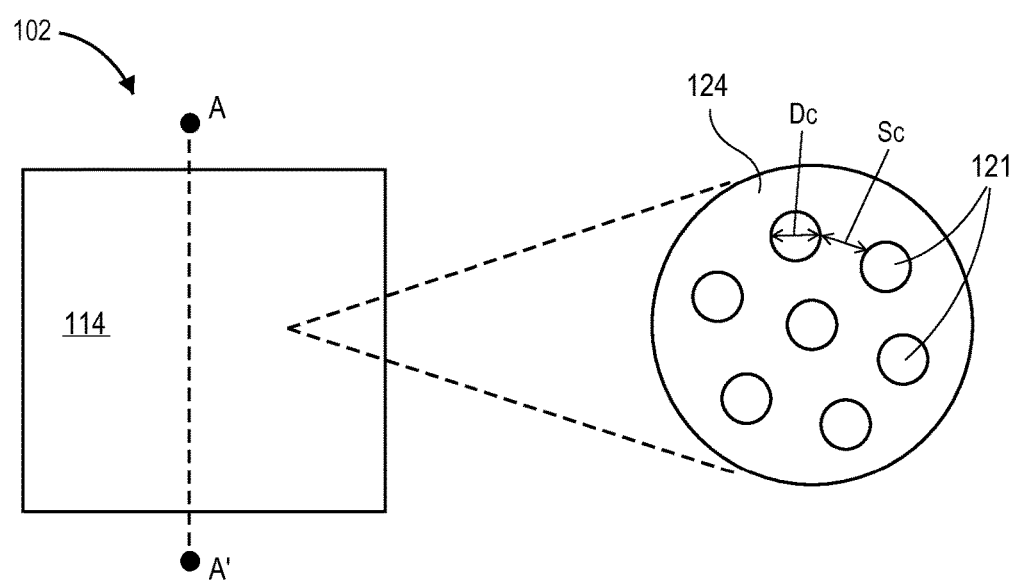
FIG. 1C illustrates a top-down view of a thermal interface material including clusters of copper nanorods disposed on the backside of a die, according to an embodiment of the invention.

FIG. 1C illustrates a top-down view of TIM 114 over the backside surface of die 102 along line A-A' in FIG. 1A, according to an embodiment of the invention. Clusters 121 are shown on copper layer 124, according to an embodiment. The optional matrix material is not shown for clarity. Clusters 121 may have a variety of footprint shapes, such as the circular shape shown in FIG. 1C. Clusters 121 may also have polygonal or irregular footprint shapes. The size and arrangement of clusters 121 may vary based on a variety of factors, for example, but not limited to, the desired properties of copper nanorod TIM 114 (e.g. the thermal resistance, the modulus, and cost), the dimensions of die 102, or by processing concerns, (e.g. the flow properties of matrix material 124). In an embodiment, clusters 121 have an average diameter $D_C$. Average diameter $D_C$ may be from 10 to 50 µm. In an embodiment, clusters 121 have an average spacing $S_C$. In an embodiment, average spacing $S_C$ is greater than 50 µm. In an embodiment, 10 to 50% of the surface area of die 102 is occupied by copper nanorods 120. In an embodiment, 10 to 50% of the volume between die 102 and IHS 110 is occupied by copper nanorods 120.

In another embodiment, the first end 117 of each copper nanorod 120 is thermally coupled to IHS 110, while second ends 119 extend toward die 102. In an embodiment, copper nanorod branches 122 extend from second end 119. In an embodiment, copper nanorod branches 122 may be metallurgically bonded to a copper layer, such as layer 124, formed over the backside of die 102.

Figure 2:
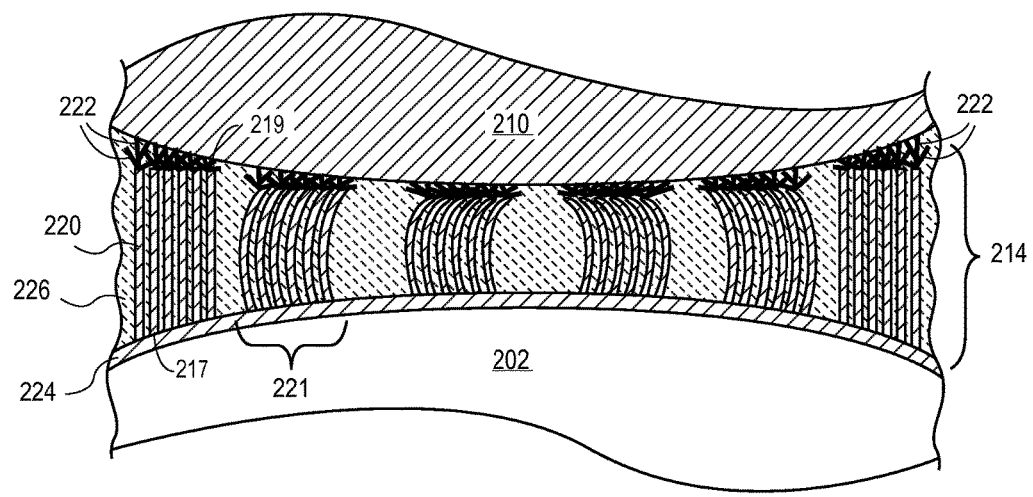
FIG. 2 illustrates a cross-sectional side view of a thermal interface material including clusters of copper nanorods thermally coupling a thermally warped backside of a die to a thermally warped heat spreader, according to an embodiment of the invention.

FIG. 2 illustrates a cross-sectional view of a copper nanorod TIM 214 thermally joining die 202 to IHS 210, according to an embodiment. TIM 214 includes copper nanorods 220 grouped into clusters 221, according to an embodiment. In an embodiment, each copper nanorod 220 has a first end 217 coupled with seed layer 224 formed over the surface of die 202, and a second end 219 extending toward IHS 210. In an embodiment, copper nanorod branches 222 are formed on second end 219. In an embodiment, matrix material 226 fills the space between copper nanorods 220.

Thermal stresses have warped die 202 and IHS 210, according to an embodiment. For example, the temperature of die 202 may change or cycle during fabrication or operation. Thermal stresses may evolve due to differences in the coefficient of thermal expansion (CTE) for the materials included within die 202. Temperature changes cause different materials within die 202 to expand and contract different amounts, which may cause warpage. Similarly, a temperature gradient within a copper IHS 210 may cause warmer areas of IHS 210 to expand relative to cooler areas, which may lead to warpage.

Copper nanorod TIM 214 includes high aspect ratio copper nanorods 220, according to an embodiment. In an embodiment, the high aspect ratio of copper nanorods 220 allow TIM 214 to deform to accommodate the warpage of die 202 and/or IHS 210. In an embodiment, the ductility of the copper may allow deformation to accommodate the warpage of die 202 and/or IHS 210. By accommodating the warpage at the thermal interface, thermal contact is preserved with both the die 202 surface and the IHS 210 surface, preventing or minimizing delamination of the TIM 214 from the thermal interface, which can lead to increased thermal resistance and reduced heat management performance.

Figure 3:
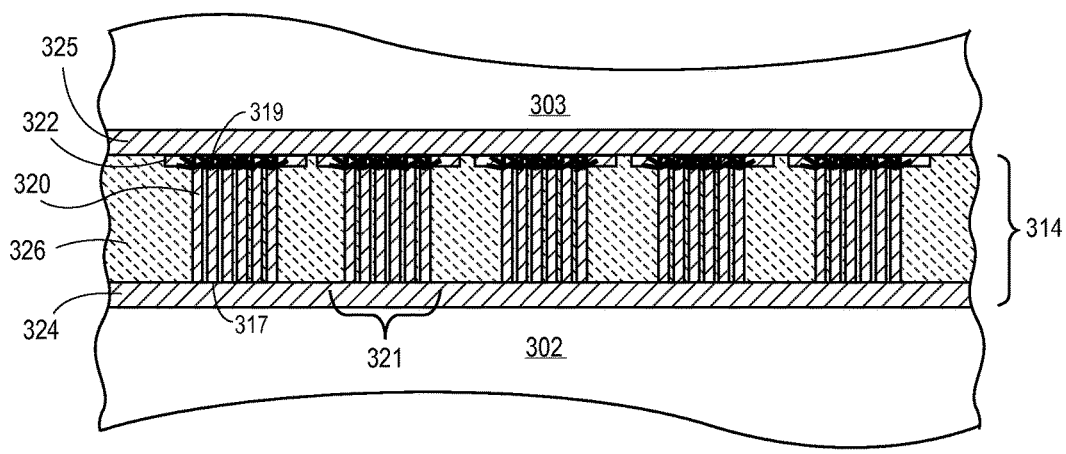
FIG. 3 illustrates a cross-sectional side view of a thermal interface material including clusters of copper nanorods thermally coupling the backside of a first die to the front side of a second die, according to an embodiment of the invention.

FIG. 3 illustrates a cross-sectional view of a copper nanorod TIM 314 thermally joining first die 302 to second die 303, such as in a package-on-package (PoP) or 3D package structure, according to an embodiment of the invention. In an embodiment, copper nanorod TIM 314 includes copper nanorods 320 having a first end 317 thermally coupled to a seed layer 324 over the backside of first die 302 and a second end 319 extending toward second die 303. Copper nanorods may be grouped into clusters 321. A plurality of copper nanorod branches 322 extend from each second end 319, according to an embodiment. In an embodiment, copper nanorod branches 322 are metallurgically bonded to copper layer 325, covering the surface of second die 303. In an embodiment, the length of copper nanorods 310 within copper nanorod TIM 314 enables a BLT from 10 to 50 µm. In another embodiment, other device components, having a seed layer 324 or copper layer 325 formed thereon, may be thermally joined by a copper nanorod TIM 314.

Figure 4:
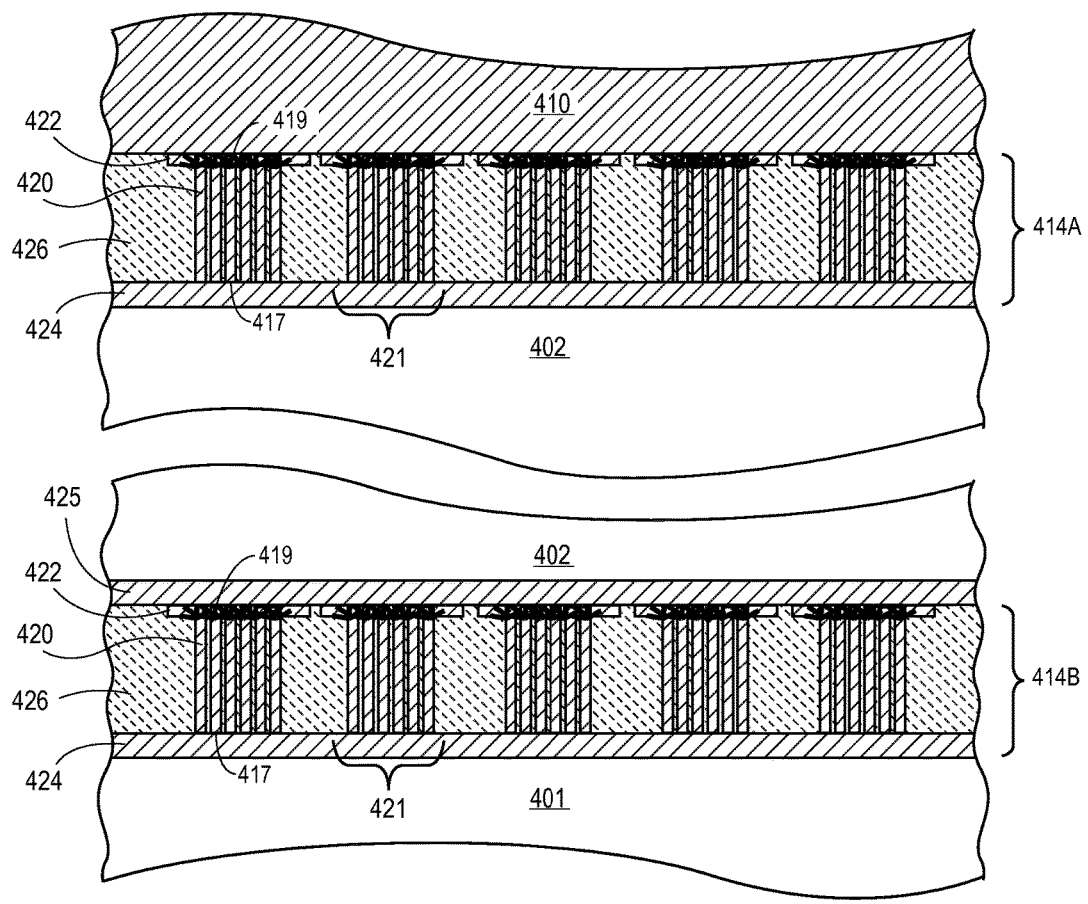
FIG. 4 illustrates a cross-sectional side view of a stacked die structure having a thermal interface material including clusters of copper nanorods thermally coupling the backside of a first die to the active side of a second die, and also thermally coupling the backside of a second die to a heat spreader, according to an embodiment of the invention.

FIG. 4 illustrates a cross-sectional view of a 3D package having a copper nanorod TIM 414A the interface first die 401 and second die 402 and copper nanorod TIM 414B the interface of second die 402 and IHS 410, according to an embodiment of the invention. By incorporating a copper nanorod TIM 414A/414B at both thermal interfaces, heat is effectively conducted between dies in the die stack to the IHS 410 in order to be removed. In an embodiment, copper nanorod TIM 414A includes copper nanorods 420 extending from a seed layer 424 over first die 402 toward IHS 410. Copper nanorod branches metallurgically bond the copper nanorods to the IHS 410, according to an embodiment. In an embodiment, copper nanorods are grouped in clusters 421. TIM 414A may include a matrix material 426.

In an embodiment, TIM 414B includes a seed layer 424 formed over the surface of second die 401. Copper nanorods 420 have a first end 417 coupled to seed layer 424 and a second end 419 extending toward first die 402, according to an embodiment. A copper layer 425 is formed over the bottom surface of first die 402, according to an embodiment.

Copper nanorod branches 422 formed on second end 419 are metallurgically bonded to copper layer 425, according to an embodiment.

Figure 5:
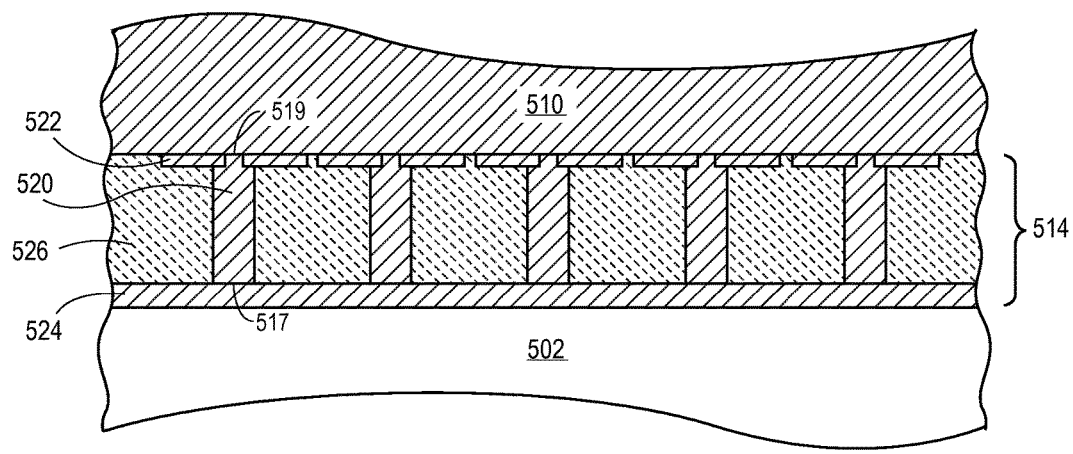
FIG. 5 illustrates a cross-sectional side view of a thermal interface material including copper nanorods thermally coupling the backside of a die to a heat spreader, according to an embodiment of the invention.

FIG. 5 illustrates a cross-sectional view of copper nanorod TIM 514 thermally joining a die 502 to an IHS 510, according to an embodiment of the invention. In an embodiment, copper nanorod TIM 514 includes copper nanorods 520 extending from the backside of die 502 toward IHS 510. In an embodiment, copper nanorods 520 have a first end 517 coupled to seed layer 524 over the surface of die 502, and a second end 519 extending towards IHS 510. Copper nanorods 520 may not be grouped into clusters, as shown in FIGS. 1-4. In an embodiment, copper nanorods 520 are uniformly distributed across the surface of seed layer 524. In an embodiment, copper nanorods 520 are randomly distributed across the surface of seed layer 524. In an embodiment, copper nanorods 520 have an average spacing greater than 10 μm. In an embodiment, copper nanorods 520 have an average spacing from 50 to 100 μm. In an embodiment, copper nanorod branches 522 metallurgically bond copper nanorods 520 to the surface of IHS 510. In an embodiment, TIM 514 includes matrix material 526 filling the space between copper nanorods 520.

Figure 6A:
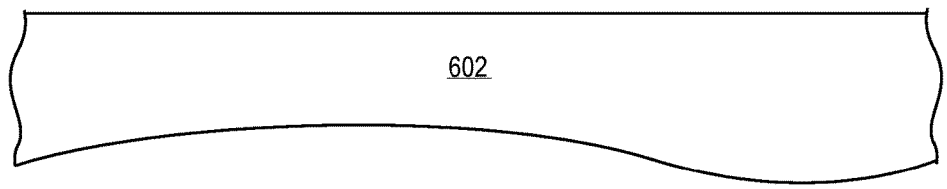
FIGS. 6A-6E illustrates cross-sectional side views of a method for forming a thermal interface material including copper nanorods thermally coupling a die to a heat spreader, according to an embodiment of the invention.

FIGS. 6A-6E illustrate cross-sectional views of a method for forming a copper nanorod TIM, according to an embodiment of the invention. In FIG. 6A, first surface 602 is provided. First surface 602 may be the surface of any heat-generating object or any heat-conduction object. First surface may be, for example, but not limited to, a die or a heat spreader. In an embodiment, first surface 602 is the backside surface of an individual die. In another embodiment, first surface 602 is the surface of a wafer including a plurality of dies. In yet another embodiment, first surface 602 is a sacrificial or template surface, on which a copper nanorod TIM may be formed, then removed from the first surface 602 and transferred to a thermal interface.

Figure 6B:
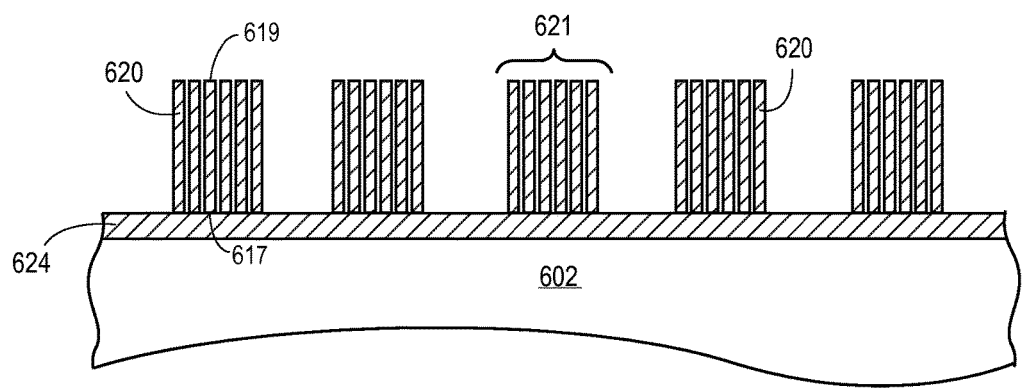

In FIG. 6B, copper nanorods 620 are grown from the first surface 602, according to an embodiment of the invention. In an embodiment, copper nanorods 620 have a first end 617 coupled with first surface 602, and a second end 619 extending away from first surface 602. Copper nanorods 620 may be in clusters 621, as shown in FIGS. 1A-4 and discussed above, or unclustered, as show in FIG. 5 and discussed above. Copper nanorods 620 may be grown from a variety of surfaces. For example, copper nanorods 620 may be grown directly from the silicon backside surface of a die. In another embodiment, copper nanorods 620 are grown from a seed layer 624 formed over first surface 602. Seed layer 624 may be any material from which copper nanorods may be grown, for example a material having an FCC crystallographic structure. Seed layer 624 may be, for example, but not limited to, copper. In an embodiment, one or more layers (not shown) are formed between first surface 602 and seed layer 624 to improve adhesion and/or serve as a diffusion barrier.

In an embodiment, a patterning layer (not shown) is formed over the seed layer 624. In an embodiment, the patterning layer self assembles to define areas where copper nanorods may be grown. The patterning layer may be, for example, a monolayer of polystyrene spheres. In another embodiment, the patterning layer may be patterned to expose portions of seed layer 624 where copper nanorods are desired, while covering portions of seed layer 624 where copper nanorods are not desired. In an embodiment, a patterning layer is used to define copper nanorod clusters 621. The patterning layer may then be removed after growth of copper nanorods 620. In another embodiment, a matrix material (for example, matrix material 626, as shown in FIG. 6E) may be used at the patterning layer, in which case the matrix material may not be removed after growth of copper nanorods 620.

Figure 7A:
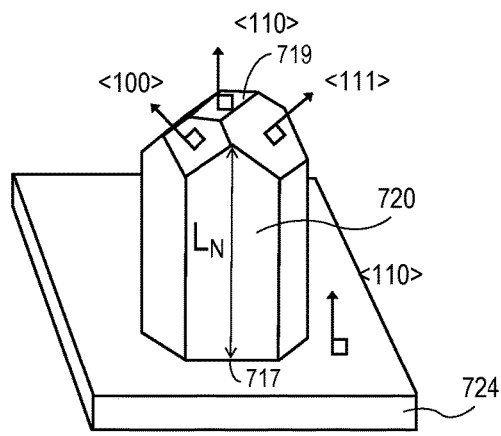
FIGS. 7A-7C illustrate three-dimensional perspective views of a copper nanorod with copper nanorod branches, grown from a surface according to an embodiment of the invention.

FIG. 7A illustrates a perspective view of an individual copper nanorod 720, grown from seed layer 724, according to an embodiment of the invention. In an embodiment, seed layer 724 is copper. In an embodiment, copper seed layer 724 has a {110} orientation in the direction normal to the surface. Copper nanorod 720 is nucleated on the surface of seed layer 724, and grown in the <110> direction, according to an embodiment. In an embodiment, copper nanorod 720 is a single crystal of copper. Copper nanorods 720 may be formed by sputtering or by glancing angle deposition (GLAD). By varying the orientation of the seed layer 724 and the deposition angle, the orientation of the copper nanorod 720 and the direction of growth may be altered. For example, copper nanorod 720 may be grown in the <110> direction from the {110} surface of seed layer 724 by sputtering or depositing at the appropriate incident angle. In an embodiment, an incident angle of 83-88° leads to growth from the {110} surface in the <110> direction. Deposition continues until the desired length, $L_N$, is achieved. Copper nanorod 720 has a first end 717 thermally coupled to seed layer 724, and a second end 719 protruding away from seed layer 724. Copper nanorod 720 may have a length $L_N$ from first end 717 to second end 719 that is from 20 to 50 μm. In an embodiment, copper nanorods may be formed at room temperature. In another embodiment, copper nanorods may be formed at a temperature less than 100° C.

Figure 6C:
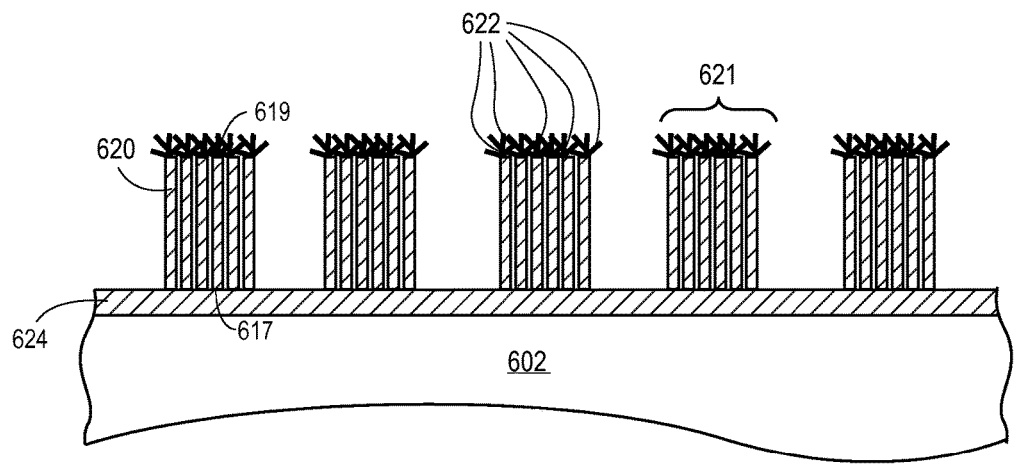
Figure 7B:
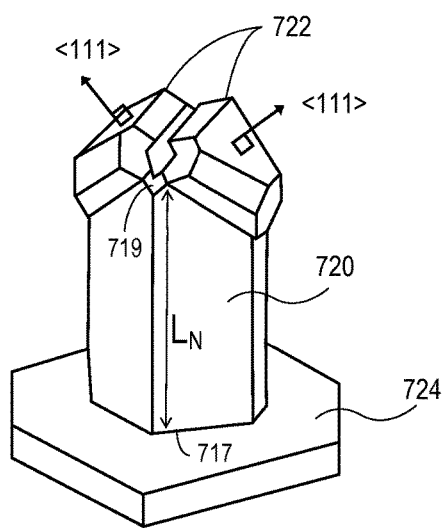
Figure 7C:
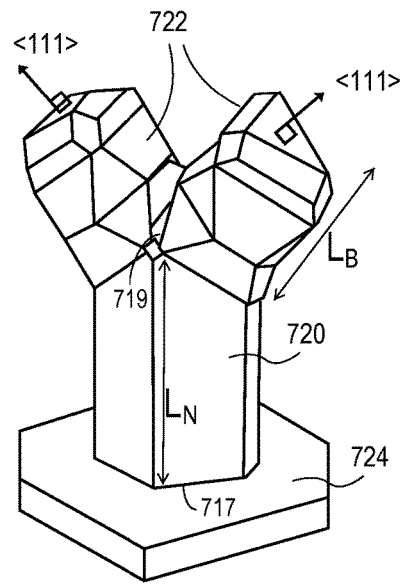

Referring now to FIG. 6C, copper nanorod branches 622 are grown from the second end 619 of copper nanorods 620, according to an embodiment of the invention. FIGS. 7B-7C illustrate perspective views of copper nanorod branches 722 grown from the second end 719 of copper nanorod 720, according to an embodiment. Due to the shadowing effect of GLAD, and the accumulation of stacking faults on the top (110) face of the copper nanorod 720, copper atoms begin to assemble on the {111} facets of the nanorod, split apart by the stacking faults on the (110) face. Continued growth forms two copper nanorod branches 722. Copper nanorod branches 722 may have a length $L_B$ less than 10 μm. In an embodiment, copper nanorod branches 722 have a length $L_B$ from 1 to 2 μm. In an embodiment, copper nanorod branches 722 have a diameter from 10 to 100 nm.

In an embodiment, copper nanorod branches 622 are then coated to inhibit the formation of native oxide. Copper nanorod branches 622 may be coated with, for example, nickel. Any appropriate method may be used to coat copper nanorod branches 622, such as, but not limited to, spray coat, PVD, and electrochemical coating. In an embodiment, copper nanorod branches 622 are not coated.

Figure 6D:
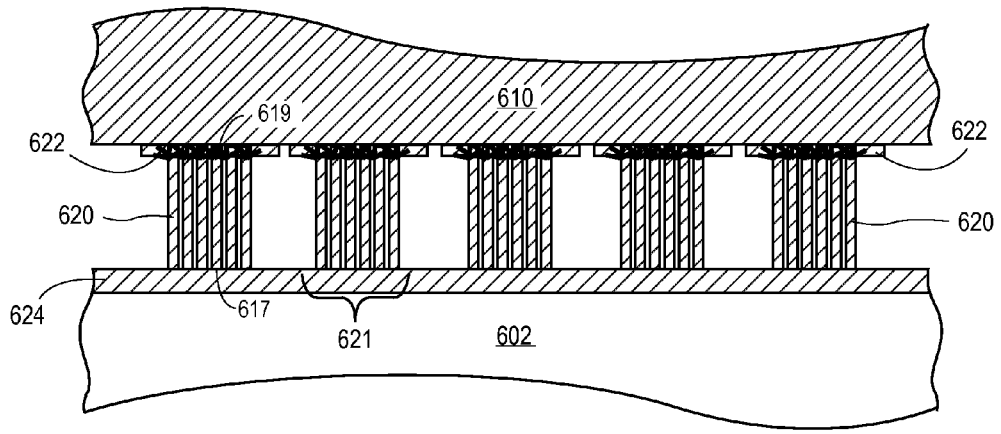
Figure 6E:
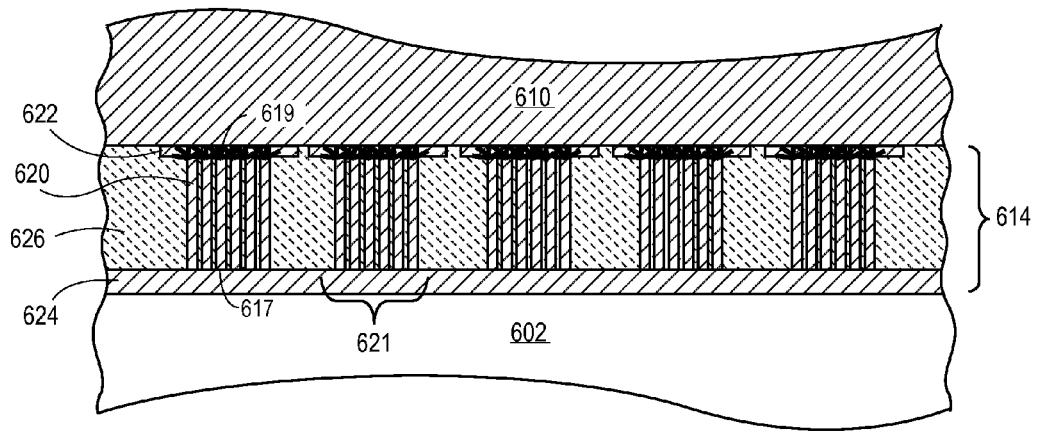

Then, in FIG. 6D, second surface 610 is metallurgically bonded to copper nanorod branches 622, according to an embodiment of the invention. In an embodiment, second surface 610 is a copper IHS, as illustrated in FIG. 6D. In another embodiment, second surface 610 is a die having a copper layer formed thereon. In another embodiment, second surface 610 is a sacrificial substrate having a copper layer formed thereon. Second surface 610 is placed in contact with copper nanorod branches 622 and heated to a temperature sufficient to metallurgically bond the copper second surface 610 and copper nanorod branches 622, according to an embodiment. Metallurgical bonding occurs at temperatures far below the melting temperature of the metal. For example, while copper melts at over 1000° C., copper rods and wires having a diameter less than 100 nm may bond to a copper surface at temperatures less than 400° C. As such, by forming copper nanorod branches 622 on second ends 619 of copper nanorods 620, low-temperature metallurgical bonding may be used. Lower temperature processing reduces the evolution of thermal stresses and associated device failures. In an embodiment, copper nanorod branches 622 are metallurgically bonded to second surface 610 at a temperature from 200 to 400° C. In an embodiment, prior to metallurgically bonding copper nanorod branches 622 to second surface 610, copper nanorod branches 622 are treated with flux to remove oxide. In an embodiment, pressure is applied to thermal interface to assist in the formation of a metallurgic bond. Optionally, in FIG. 6E, matrix material 626 may be applied to fill a portion of the remaining space between first surface 602 and second surface 610. Matrix material 626 may be injected. In an embodiment, matrix material 626 is dispensed prior to assembly.

As such, a copper nanorod TIM 614 having reduced thermal resistance is formed. The high bulk conductivity of copper nanorods 620, low BLT, and low contact resistance due to metallurgical bonding enable copper nanorod TIM 614 to have an ultra-low thermal resistance, according to an embodiment. In an embodiment, copper nanorod TIM 614 has a thermal resistance less that 0.3 C-cm$^2$/W. In an embodiment, copper nanorod TIM 614 has a thermal resistance from 0.1 to 0.2 C-cm$^2$/W.

In an embodiment where copper nanorod TIM 614 was formed using a sacrificial first surface 602 and a sacrificial second surface 610, copper nanorod TIM 614 is then removed from between first surface 602 and second surface 610. Copper nanorod TIM 614 may then be applied to a thermal interface, such as between a die and an IHS.

Figure 8:
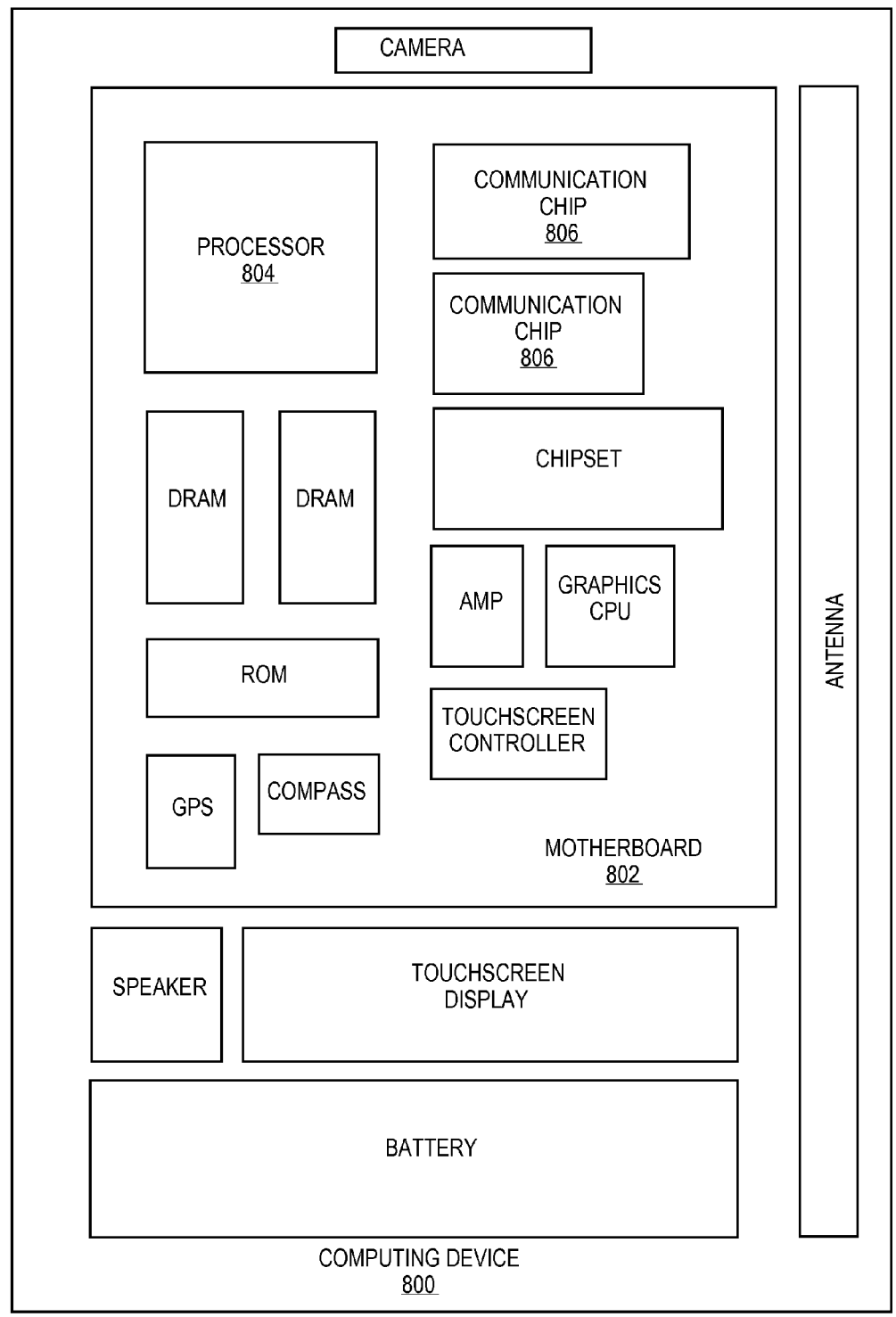
FIG. 8 illustrates a computing system implemented with a thermal interface material including copper nanorods, in accordance with an example embodiment of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others. The communication chip 806 also includes an integrated circuit die packaged within the communication chip 806. In an embodiment, communication chip 806 is thermally coupled to a thermal management structure using a thermal interface material including copper nanorods metallurgically bonded to the thermal management structure, in accordance with embodiments of the invention.

The processor 804 of the computing device 800 includes an integrated circuit die packaged within the processor 804. In an embodiment, processor 804 is thermally coupled to a thermal management structure using a thermal interface material including copper nanorods metallurgically bonded to the thermal management structure, in accordance with embodiments of the invention. The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In an embodiment, a thermal interface material comprises a plurality of copper nanorods, each having a first end thermally coupled with a first surface and a second end extending toward a second surface, wherein the second surface is copper; and a plurality of copper nanorod branches extending from each second end, wherein the copper nanorod branches are metallurgically bonded to the second surface. In an embodiment, the thermal interface material has a thermal resistivity less than 0.03 C-cm$^2$/W. In an embodiment, the copper nanorods have a diameter less than 20 μm. In an embodiment, the copper nanorods have a length from 5 μm to 50 μm. In an embodiment, the copper nanorods are spaced from 5 nm to 10 μm apart. In an embodiment, 10% to 50% of a surface area of the first surface is occupied by copper nanorods. In an embodiment, 10% to 50% of a volume between the first surface and the second surface is occupied by copper nanorods. In an embodiment, the copper nanorods are clustered in a plurality of nanorod clusters. In an embodiment, the nanorod clusters have an average diameter from 50 to 100 μm. In an embodiment, the clusters have an average spacing from 50 to 100 μm. In an embodiment, the thermal interface material further comprises a matrix material between the first surface and the second surface. In an embodiment, the first surface is copper and the first ends are metallurgically bonded with the first surface. In an embodiment, the copper nanorods have a <110> orientation along a central axis. In an embodiment, the copper branches extend from <111> facets on the second end of the copper nanorods.

In an embodiment, a microelectronic package comprises a substrate; a die electrically coupled with the substrate; an integrated heat spreader overlying the die; and a thermal interface material thermally coupling the integrated heat spreader with a back surface of the die, wherein the TIM comprises: a plurality of copper nanorods, each having a first end thermally coupled with the back surface of the die and a second end extending toward the integrated heat spreader; and a plurality of copper nanorod branches extending from each second end, wherein the copper nanorod branches are metallurgically bonded to the integrated heat spreader. In an embodiment, a bond line thickness (BLT) between the back surface of the die and the integrated heat spreader is less than 50 μm. In an embodiment, the copper nanorods have a diameter less than 20 μm. In an embodiment, the thermal interface material further comprises a matrix material between the back surface of the first die and the integrated heat spreader. In an embodiment, the thermal interface material further comprises a copper layer formed over the back surface of the die, wherein the first ends are metallurgically bonded with the copper layer. In an embodiment, the nanorods are clustered in a plurality of nanorod clusters.

In an embodiment, a microelectronic package comprises a first die having a first surface; a second die having a second surface; and a thermal interface material thermally coupling the first surface with the second surface, wherein the thermal interface material comprises: a copper layer formed over the second surface; a plurality of copper nanorods, each having a first end thermally coupled with the first surface and a second end extending toward the copper layer; and a plurality of copper nanorod branches extending from each second end, wherein the copper nanorod branches are metallurgically bonded to the copper layer. In an embodiment, the thermal interface material further comprises a matrix material between the back surface of the first die and the copper layer. In an embodiment, the nanorods are clustered in a plurality of nanorod clusters.

In an embodiment, a method for thermally coupling a first surface and a second surface comprises growing a plurality of copper nanorods from the first surface, wherein the copper nanorods have a first end thermally coupled with the first surface and a second end extending away from the first surface; growing a plurality of copper nanorod branches on each second end; and metallurgically bonding the second surface to the copper nanorod branches, wherein the second surface is copper. In an embodiment, the method further comprises, prior to growing a plurality of copper nanorods, forming a patterning layer over the first surface; and patterning the patterning layer to expose portions of the first surface. In an embodiment, metallurgically bonding the second surface to the copper nanorod branches comprises heating the nanorod branches and the second surface to a temperature less than 400° C. In an embodiment, the method further comprises underfilling the remaining space between the first surface and the second surface with a matrix material. In an embodiment, the method further comprises forming a nickel layer on the copper nanorods and copper nanorod branches to prevent oxidation. In an embodiment, the method further comprises introducing a fluxing agent to remove oxide from the copper nanorods and copper nanorod branches. In an embodiment, the copper nanorods are grown by one of sputter deposition and vapor deposition.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the internal spacers and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A thermal interface material, comprising:
   a plurality of copper nanorods, each having a first end thermally coupled with a first surface and a second end extending toward a second surface, wherein the second surface is copper; and
   a plurality of copper nanorod branches extending from each second end, wherein the copper nanorod branches have a Cu—Cu metallurgic bond to the second surface.

2. The thermal interface material of claim 1, wherein the thermal interface material has a thermal resistivity less than 0.03 C-cm²/W.

3. The thermal interface material of claim 1, wherein the copper nanorods have a diameter less than 20 μm.

4. The thermal interface material of claim 1, wherein the copper nanorods have a length from 5 μm to 50 μm.

5. The thermal interface material of claim 1, wherein the copper nanorods are spaced from 5 nm to 10 μm apart.

6. The thermal interface material of claim 1, wherein 10% to 50% of a surface area of the first surface is occupied by copper nanorods.

7. The thermal interface material of claim 1, wherein 10% to 50% of a volume between the first surface and the second surface is occupied by copper nanorods.

8. The thermal interface material of claim 1, wherein the copper nanorods are clustered in a plurality of nanorod clusters.

9. The thermal interface material of claim 8, wherein the nanorod clusters have an average diameter from 50 to 100 μm.

10. The thermal interface material of claim 8, wherein the clusters have an average spacing from 50 to 100 μm.

11. The thermal interface material of claim 1, further comprising a matrix material between the first surface and the second surface.

12. The thermal interface material of claim 1, wherein the first surface is copper, and wherein the first ends are metallurgically bonded with the first surface.

13. The thermal interface material of claim 1, wherein the copper nanorods have a <110> orientation along a central axis.

14. The thermal interface material of claim 1, wherein the copper branches extend from <111> facets on the second end of the copper nanorods.

15. A method for thermally coupling a first surface and a second surface, comprising:
   growing a plurality of copper nanorods from the first surface, wherein the copper nanorods have a first end thermally coupled with the first surface and a second end extending away from the first surface;
   growing a plurality of copper nanorod branches on each second end; and
   metallurgically bonding the second surface to the copper nanorod branches, wherein the second surface is copper wherein the copper nanorod branches have a Cu—Cu metallurgic bond to the second surface.

16. The method of claim 15, further comprising, prior to growing a plurality of copper nanorods:
   forming a patterning layer over the first surface; and
   patterning the patterning layer to expose portions of the first surface.

17. The method of claim 15, wherein metallurgically bonding the second surface to the copper nanorod branches comprises heating the nanorod branches and the second surface to a temperature less than 400° C.

18. The method of claim 15, further comprising underfilling the remaining space between the first surface and the second surface with a matrix material.

19. The method of claim 15, further comprising forming a nickel layer on the copper nanorods and copper nanorod branches to prevent oxidation.

20. The method of claim 15, further comprising introducing a fluxing agent to remove oxide from the copper nanorods and copper nanorod branches.

21. The method of claim 15, wherein the copper nanorods are grown by one of sputter deposition and vapor deposition.

* * * * *